(12) United States Patent
Goergen et al.

(10) Patent No.: US 11,252,811 B2
(45) Date of Patent: Feb. 15, 2022

(54) POWER DISTRIBUTION FROM POINT-OF-LOAD WITH COOLING

(71) Applicant: CISCO TECHNOLOGY, INC., San Jose, CA (US)

(72) Inventors: Joel Richard Goergen, Soulsbyville, CA (US); Jessica Kiefer, San Jose, CA (US); Ashley Julia Maker Erickson, Danville, CA (US); Yi Tang, San Jose, CA (US); M. Baris Dogruoz, Santa Clara, CA (US); Elizabeth Ann Kochuparambil, Morgan Hill, CA (US); Shobhana Punjabi, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 39 days.

(21) Appl. No.: 16/743,371

(22) Filed: Jan. 15, 2020

(65) Prior Publication Data
US 2021/0219415 A1    Jul. 15, 2021

(51) Int. Cl.
H05K 1/02 (2006.01)
H01R 12/71 (2011.01)
H05K 7/20 (2006.01)

(52) U.S. Cl.
CPC ......... *H05K 1/0204* (2013.01); *H01R 12/716* (2013.01); *H05K 7/20509* (2013.01); *H05K 1/0206* (2013.01); *H05K 2201/10378* (2013.01); *H05K 2201/10416* (2013.01)

(58) Field of Classification Search
CPC ............... H05K 1/0204; H05K 1/0206; H05K 7/20509; H05K 2201/10378; H05K 2201/10416; H01R 12/716
See application file for complete search history.

(56) References Cited

U.S. PATENT DOCUMENTS

| 3,335,324 | A | 8/1967 | Buckeridge |
| 4,811,187 | A | 3/1989 | Nakajima |
| 5,014,904 | A * | 5/1991 | Morton ................ H05K 1/0204 228/123.1 |
| 5,053,920 | A | 10/1991 | Staffiere et al. |
| 5,652,893 | A | 7/1997 | Ben-Meir |
| 5,901,040 | A | 5/1999 | Cromwell et al. |
| 6,008,631 | A | 12/1999 | Johari |

(Continued)

FOREIGN PATENT DOCUMENTS

| CN | 1209880 C | 7/2005 |
| CN | 201689347 U | 12/2010 |

(Continued)

OTHER PUBLICATIONS https://www.fischerconnectors.com/us/en/products/fiberoptic.

(Continued)

*Primary Examiner* — Jacob R Crum

(57) ABSTRACT

In one embodiment, an apparatus includes a substrate comprising a first surface and a second surface opposite to the first surface, an integrated circuit attached to the first surface of the substrate, and a cold plate attached to the second surface of the substrate with an electrical path extending through the cold plate for transmitting power from a power component connected to the cold plate, to the integrated circuit.

30 Claims, 13 Drawing Sheets

(56) References Cited

U.S. PATENT DOCUMENTS

| | | |
|---|---|---|
| 6,220,955 B1 | 4/2001 | Posa |
| 6,259,745 B1 | 7/2001 | Chan |
| 6,285,550 B1 | 9/2001 | Belady |
| 6,636,538 B1 | 10/2003 | Stephens |
| 6,685,364 B1 | 2/2004 | Brezina |
| 6,690,696 B2 | 2/2004 | Byren et al. |
| 6,784,790 B1 | 8/2004 | Lester |
| 6,826,368 B1 | 11/2004 | Koren |
| 6,855,881 B2 | 2/2005 | Khoshnood |
| 6,860,004 B2 | 3/2005 | Hirano |
| 7,266,267 B2 | 9/2007 | Bakir et al. |
| 7,310,430 B1 | 12/2007 | Mallya et al. |
| 7,325,150 B2 | 1/2008 | Lehr |
| 7,420,355 B2 | 9/2008 | Liu |
| 7,490,996 B2 | 2/2009 | Sommer |
| 7,492,059 B2 | 2/2009 | Peker |
| 7,509,505 B2 | 3/2009 | Randall |
| 7,583,703 B2 | 9/2009 | Bowser |
| 7,589,435 B2 | 9/2009 | Metsker |
| 7,593,747 B1 | 9/2009 | Karam |
| 7,603,570 B2 | 10/2009 | Schindler |
| 7,616,465 B1 | 11/2009 | Vinciarelli |
| 7,668,941 B1 * | 2/2010 | Kathandapani ..... H04L 61/6022 709/220 |
| 7,813,646 B2 | 10/2010 | Furey |
| 7,835,389 B2 | 11/2010 | Yu |
| 7,854,634 B2 | 12/2010 | Filipon |
| 7,881,072 B2 | 2/2011 | DiBene |
| 7,915,761 B1 | 3/2011 | Jones |
| 7,921,307 B2 | 4/2011 | Karam |
| 7,924,579 B2 | 4/2011 | Arduini |
| 7,940,787 B2 | 5/2011 | Karam |
| 7,971,440 B2 * | 7/2011 | Chan ...... H01L 35/30 62/3.7 |
| 7,973,538 B2 | 7/2011 | Karam |
| 8,020,043 B2 | 9/2011 | Karam |
| 8,037,324 B2 | 10/2011 | Hussain |
| 8,081,589 B1 | 12/2011 | Gilbrech |
| 8,184,525 B2 | 5/2012 | Karam |
| 8,276,397 B1 | 10/2012 | Carlson |
| 8,279,883 B2 | 10/2012 | Diab |
| 8,310,089 B2 | 11/2012 | Schindler |
| 8,319,627 B2 | 11/2012 | Chan |
| 8,345,439 B1 | 1/2013 | Goergen |
| 8,350,538 B2 | 1/2013 | Cuk |
| 8,358,893 B1 | 1/2013 | Sanderson |
| 8,700,923 B2 | 4/2014 | Fung |
| 8,712,324 B2 | 4/2014 | Corbridge |
| 8,750,710 B1 | 6/2014 | Hirt |
| 8,781,637 B2 | 7/2014 | Eaves |
| 8,787,775 B2 | 7/2014 | Earnshaw |
| 8,829,917 B1 | 9/2014 | Lo |
| 8,836,228 B2 | 9/2014 | Xu |
| 8,842,430 B2 | 9/2014 | Hellriegel |
| 8,849,471 B2 | 9/2014 | Daniel |
| 8,966,747 B2 | 3/2015 | Vinciarelli |
| 9,019,895 B2 | 4/2015 | Li |
| 9,024,473 B2 | 5/2015 | Huff |
| 9,184,795 B2 | 11/2015 | Eaves |
| 9,189,036 B2 | 11/2015 | Ghoshal |
| 9,189,043 B2 | 11/2015 | Vorenkamp |
| 9,273,906 B2 | 3/2016 | Goth |
| 9,319,101 B2 | 4/2016 | Lontka |
| 9,321,362 B2 | 4/2016 | Woo |
| 9,373,963 B2 | 6/2016 | Kuznelsov |
| 9,419,436 B2 | 8/2016 | Eaves |
| 9,510,479 B2 | 11/2016 | Vos |
| 9,531,551 B2 | 12/2016 | Balasubramanian |
| 9,590,811 B2 | 3/2017 | Hunter, Jr. |
| 9,618,714 B2 | 4/2017 | Murray |
| 9,640,998 B2 | 5/2017 | Dawson |
| 9,646,916 B1 | 5/2017 | Emma |
| 9,665,148 B2 | 5/2017 | Hamdi |
| 9,693,244 B2 | 6/2017 | Maruhashi |
| 9,734,940 B1 | 8/2017 | McNutt |
| 9,853,689 B2 | 12/2017 | Eaves |
| 9,874,930 B2 | 1/2018 | Vavilala |
| 9,882,656 B2 | 1/2018 | Sipes, Jr. |
| 9,893,521 B2 | 2/2018 | Lowe |
| 9,948,198 B2 | 4/2018 | Imai |
| 9,979,370 B2 | 5/2018 | Xu |
| 9,985,600 B2 | 5/2018 | Xu |
| 10,007,628 B2 | 6/2018 | Pitigoi-Aron |
| 10,028,417 B2 | 7/2018 | Schmidtke |
| 10,128,764 B1 | 11/2018 | Vinciarelli |
| 10,211,590 B2 | 2/2019 | Filgas et al. |
| 10,248,178 B2 | 4/2019 | Brooks |
| 10,407,995 B2 | 9/2019 | Moeny |
| 10,439,432 B2 | 10/2019 | Eckhardt |
| 10,541,758 B2 | 1/2020 | Goergen |
| 10,631,443 B2 | 4/2020 | Byers |
| 10,672,537 B2 | 6/2020 | Goergen |
| 10,732,688 B2 | 8/2020 | Goergen |
| 10,735,105 B2 | 8/2020 | Goergen |
| 10,809,134 B2 | 10/2020 | Bullock |
| 10,958,471 B2 | 3/2021 | Goergen |
| 2001/0024373 A1 | 9/2001 | Cuk |
| 2002/0126967 A1 | 9/2002 | Panak |
| 2003/0147225 A1 | 8/2003 | Kenny, Jr. et al. |
| 2004/0000816 A1 | 1/2004 | Khoshnood |
| 2004/0033076 A1 | 2/2004 | Song |
| 2004/0043651 A1 | 3/2004 | Bain |
| 2004/0073703 A1 | 4/2004 | Boucher |
| 2004/0264214 A1 | 12/2004 | Xu |
| 2005/0197018 A1 | 9/2005 | Lord |
| 2005/0259396 A1 * | 11/2005 | Barson ...... H05K 7/20254 361/699 |
| 2005/0268120 A1 | 12/2005 | Schindler |
| 2006/0202109 A1 | 9/2006 | Delcher |
| 2006/0209875 A1 | 9/2006 | Lum |
| 2007/0103168 A1 | 5/2007 | Batten |
| 2007/0236853 A1 | 10/2007 | Crawley |
| 2007/0263675 A1 | 11/2007 | Lum |
| 2007/0284946 A1 | 12/2007 | Robbins |
| 2007/0288125 A1 | 12/2007 | Quaratiello |
| 2008/0198635 A1 | 8/2008 | Hussain |
| 2008/0229120 A1 | 9/2008 | Diab |
| 2008/0310067 A1 | 12/2008 | Diab |
| 2009/0041466 A1 * | 2/2009 | Patel ...... H04B 10/803 398/130 |
| 2009/0213541 A1 * | 8/2009 | Butterbaugh ...... H01L 23/473 361/689 |
| 2010/0077239 A1 | 3/2010 | Diab |
| 2010/0117808 A1 | 5/2010 | Karam |
| 2010/0171602 A1 | 7/2010 | Kabbara |
| 2010/0187683 A1 | 7/2010 | Bakir et al. |
| 2010/0190384 A1 | 7/2010 | Lanni |
| 2010/0237846 A1 | 9/2010 | Vetteth |
| 2010/0290190 A1 | 11/2010 | Chester |
| 2011/0004773 A1 | 1/2011 | Hussain |
| 2011/0007664 A1 | 1/2011 | Diab |
| 2011/0083824 A1 | 4/2011 | Rogers |
| 2011/0228578 A1 | 9/2011 | Serpa |
| 2011/0266867 A1 | 12/2011 | Schindler |
| 2011/0290497 A1 | 12/2011 | Stenevik |
| 2012/0064745 A1 | 3/2012 | Ottliczky |
| 2012/0170927 A1 | 7/2012 | Huang |
| 2012/0201089 A1 | 8/2012 | Barth |
| 2012/0231654 A1 | 9/2012 | Conrad |
| 2012/0287582 A1 * | 11/2012 | Vinciarelli ...... H01F 27/2804 361/728 |
| 2012/0317426 A1 | 12/2012 | Hunter, Jr. |
| 2012/0319468 A1 | 12/2012 | Schneider |
| 2013/0077923 A1 | 3/2013 | Weem |
| 2013/0079633 A1 | 3/2013 | Weem |
| 2013/0103220 A1 | 4/2013 | Eaves |
| 2013/0249292 A1 | 9/2013 | Blackwell, Jr. |
| 2013/0272721 A1 | 10/2013 | Van Veen |
| 2014/0111180 A1 | 4/2014 | Vladan |
| 2014/0129850 A1 | 5/2014 | Paul |
| 2014/0258742 A1 | 9/2014 | Chien |
| 2014/0265550 A1 | 9/2014 | Milligan |
| 2014/0372773 A1 | 12/2014 | Heath |
| 2015/0078740 A1 | 3/2015 | Sipes, Jr. |

(56) References Cited

U.S. PATENT DOCUMENTS

| | | |
|---|---|---|
| 2015/0106539 A1 | 4/2015 | Leinonen |
| 2015/0115741 A1 | 4/2015 | Dawson |
| 2015/0215001 A1 | 7/2015 | Eaves |
| 2015/0215131 A1 | 7/2015 | Paul |
| 2015/0333918 A1 | 11/2015 | White, III |
| 2015/0340818 A1 | 11/2015 | Scherer |
| 2016/0020911 A1 | 1/2016 | Sipes, Jr. |
| 2016/0064938 A1 | 3/2016 | Balasubramanian |
| 2016/0111877 A1 | 4/2016 | Eaves |
| 2016/0118784 A1 | 4/2016 | Saxena |
| 2016/0133355 A1 | 5/2016 | Glew |
| 2016/0134331 A1 | 5/2016 | Eaves |
| 2016/0142217 A1 | 5/2016 | Gardner |
| 2016/0197600 A1 | 7/2016 | Kuznetsov |
| 2016/0365967 A1 | 7/2016 | Tu |
| 2016/0241148 A1 | 8/2016 | Kizilyalli |
| 2016/0259140 A1 | 9/2016 | Blomster |
| 2016/0262288 A1 | 9/2016 | Chainer |
| 2016/0273722 A1 | 9/2016 | Crenshaw |
| 2016/0294500 A1 | 10/2016 | Chawgo |
| 2016/0308683 A1 | 10/2016 | Pischl |
| 2016/0352535 A1 | 12/2016 | Hiscock |
| 2017/0023996 A1* | 1/2017 | Lou ............... G06F 1/3275 |
| 2017/0041152 A1 | 2/2017 | Sheffield |
| 2017/0041153 A1 | 2/2017 | Picard |
| 2017/0054296 A1 | 2/2017 | Daniel |
| 2017/0110871 A1 | 4/2017 | Foster |
| 2017/0123466 A1 | 5/2017 | Carnevale |
| 2017/0146260 A1 | 5/2017 | Ribbich |
| 2017/0155517 A1 | 6/2017 | Cao |
| 2017/0164525 A1 | 6/2017 | Chapel |
| 2017/0155518 A1 | 7/2017 | Yang |
| 2017/0214236 A1 | 7/2017 | Eaves |
| 2017/0229886 A1 | 8/2017 | Eaves |
| 2017/0234738 A1 | 8/2017 | Ross |
| 2017/0244318 A1 | 8/2017 | Giuliano |
| 2017/0248976 A1 | 8/2017 | Moller |
| 2017/0303431 A1* | 10/2017 | Kim ............... H01L 23/473 |
| 2017/0325320 A1 | 11/2017 | Wendt |
| 2018/0024964 A1 | 1/2018 | Mao |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello |
| 2018/0102604 A1 | 4/2018 | Keith |
| 2018/0123360 A1 | 5/2018 | Eaves |
| 2018/0159430 A1 | 6/2018 | Albert |
| 2018/0182686 A1* | 6/2018 | Brunschwiler ....... H01L 23/473 |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec |
| 2019/0044002 A1* | 2/2019 | Byrd ............... H01L 31/02019 |
| 2019/0204023 A1* | 7/2019 | Takken ............... F28F 3/04 |
| 2019/0267804 A1 | 8/2019 | Matan |
| 2019/0272011 A1 | 9/2019 | Goergen |
| 2019/0279971 A1* | 9/2019 | Leobandung ........... H01L 24/92 |
| 2019/0280895 A1 | 9/2019 | Mather |
| 2019/0313522 A1* | 10/2019 | Trulli ............... H05K 1/0204 |
| 2019/0363493 A1 | 11/2019 | Sironi |
| 2020/0295955 A1* | 9/2020 | O'Brien ............... H04L 12/4641 |
| 2020/0357721 A1* | 11/2020 | Sankman ............... H01L 25/072 |

FOREIGN PATENT DOCUMENTS

| | | |
|---|---|---|
| CN | 204836199 U | 12/2015 |
| CN | 205544597 | 8/2016 |
| CN | 104081237 B | 10/2016 |
| CN | 104412541 B | 5/2019 |
| EP | 1936861 | 6/2008 |
| EP | 2120443 | 11/2009 |
| EP | 2693688 | 2/2014 |
| WO | WO199316407 A1 | 8/1993 |
| WO | WO2010053542 | 5/2010 |
| WO | WO2017054030 | 4/2017 |
| WO | WO2017167926 A1 | 10/2017 |
| WO | WO2018017544 A1 | 1/2018 |
| WO | WO2019023731 A1 | 2/2019 |

OTHER PUBLICATIONS http://www.strantech.com/products/tfoca-genx-hybrid-2x2-fiber-optic-copper-connector/.

http://www.qpcfiber.com/product/connectors/e-link-hybrid-connector/.

https://www.lumentum.com/sites/default/files/technical-library-items/poweroverfiber-tn-pv-ae_0.pdf.

"Network Remote Power Using Packet Energy Transfer", Eaves et al., www.voltserver.com, Sep. 2012.

Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.

Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.

Yencheck, Thermal Modeling of Portable Power Cables, 1993.

Zhang, Machine Learning-Based Temperature Prediction for Runtime Thermal Management across System Components, Mar. 2016.

Data Center Power Equipment Thermal Guidelines and Best Practices.

Dynamic Thermal Rating of Substation Terminal Equipment by Rambabu Adapa, 2004.

Chen, Real-Time Termperature Estimation for Power MOSEFETs Conidering Thermal Aging Effects:, IEEE Trnasactions on Device and Materials Reliability, vol. 14, No. 1, Mar. 2014.

Jingquan Chen et al: "Buck-boost PWM converters having two independently controlled switches", 32nd Annual IEEE Power Electronics Specialists Conference. PESC 2001. Conference Proceedings, Vancouver, Canada, Jun. 17-21, 2001; [Annual Power Electronics Specialists Conference], New York, NY: IEEE, US, vol. 2, Jun. 17, 2001 (Jun. 17, 2001), pp. 736-741, XP010559317, DOI: 10.1109/PESC.2001.954206, ISBN 978-0-7803-7067-8 paragraph [SectionII]; figure 3.

Cheng K W E et al: "Constant Frequency, Two-Stage Quasiresonant Convertor", IEE Proceedings B. Electrical Power Applications, 1271980 1, vol. 139, No. 3, May 1, 1992 (May 1, 1992), pp. 227-237, XP000292493, the whole document.

* cited by examiner

POWER DISTRIBUTION FROM POINT-OF-LOAD WITH COOLING

TECHNICAL FIELD

The present disclosure relates generally to power distribution, and more particularly, to power distribution from a point-of-load (POL) with cooling.

BACKGROUND

As ASIC (Application-Specific Integrated Circuit) process nodes advance and device power continues to increase, delivering requisite power is becoming more challenging. Higher power distribution also presents additional thermal challenges.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
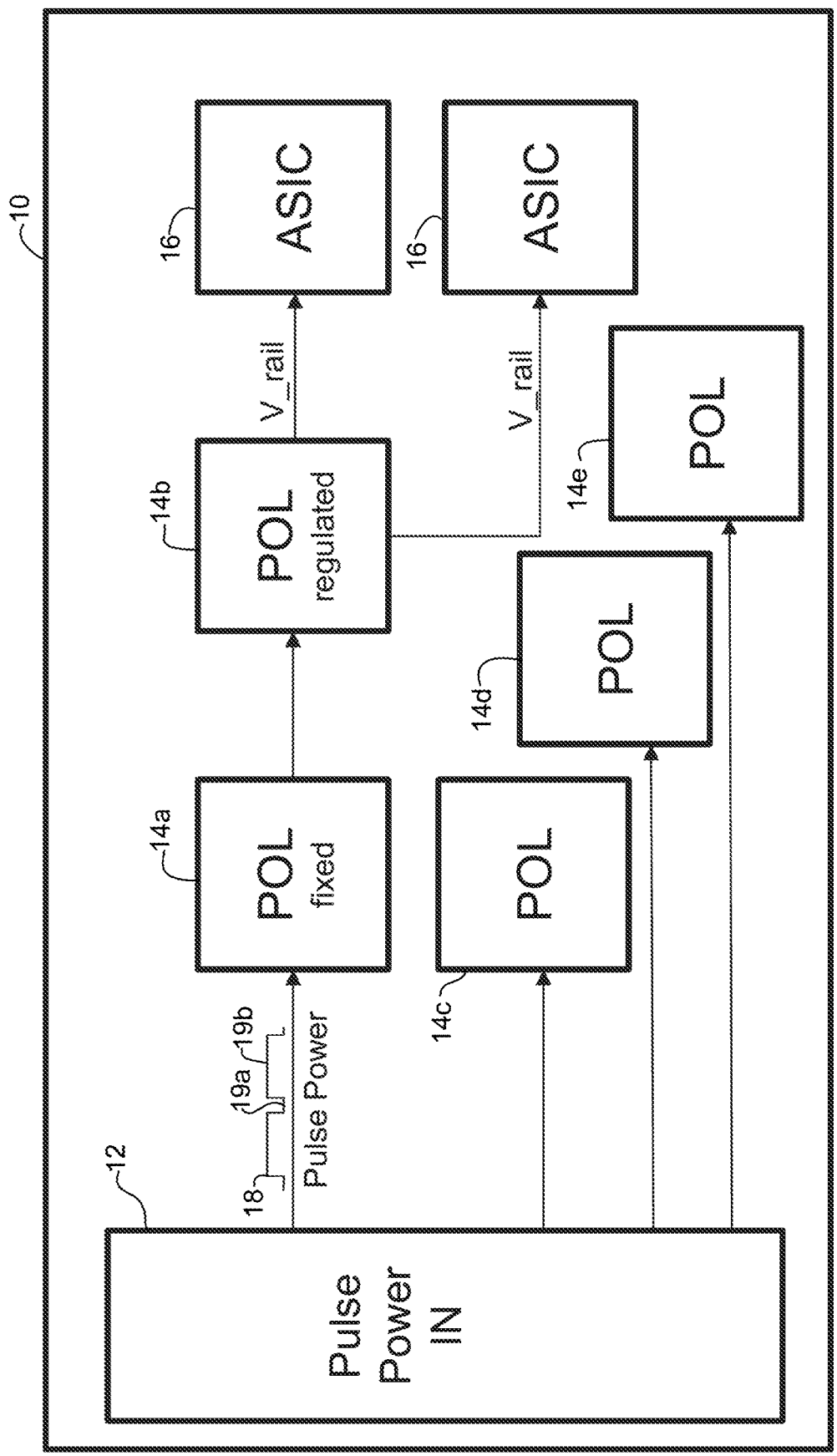
FIG. 1 is a block diagram illustrating an example of power distribution through Point-of-Load (POL) modules.

In one embodiment, an apparatus generally comprises a substrate comprising a first surface and a second surface opposite to the first surface, an integrated circuit attached to the first surface of the substrate, and a cold plate attached to the second surface of the substrate with an electrical path extending through the cold plate for transmitting power from a power component connected to the cold plate, to the integrated circuit.

In one or more embodiments, the cold plate comprises a plurality of electrical paths for transmitting power from the power component to the integrated circuit.

In one or more embodiments, the power component comprises a regulated point-of-load (POL) module interconnected with a fixed POL module via an electrical connection.

In one or more embodiments, the substrate and the integrated circuit comprise a multi-chip module.

In one or more embodiments, the integrated circuit comprises an ASIC (Application-Specific Integrated Circuit) operable to perform network processing functions.

In one or more embodiments, the apparatus further comprises a second cold plate and a thermal interposer positioned between the second cold plate and the integrated circuit.

In one or more embodiments, the cold plate comprises a power delivery block inserted into the cold plate, the electrical path extending through the power delivery block.

In one or more embodiments, the power delivery block comprises a printed circuit board and the electrical path comprises a power via formed in the printed circuit board.

In one or more embodiments, the power is transmitted through the power via at a current of at least 10 amps.

In one or more embodiments, the cold plate comprises a plurality of printed circuit boards inserted into the cold plate, each of the printed circuit boards comprising at least one power via forming the electrical path.

In one or more embodiments, the power component is configured for receiving pulse power.

In one or more embodiments, at least one component on the substrate is coupled to fiber and copper connections.

In one or more embodiments, the cold plate further comprises a communication path for transmitting communications through the cold plate.

In one or more embodiments, the cold plate further comprises an opening for transmitting optics through the cold plate.

In one or more embodiments, the cold plate comprises a multi-phase cold plate.

In one or more embodiments, the power component comprises a fixed point-of-load (POL) module and the electrical path comprises a regulated POL module located within the cold plate and coupled to the fixed POL module for delivering the power from the fixed POL module to the integrated circuit.

In another embodiment, an apparatus generally comprises a point-of-load (POL) power supply comprising a fixed POL interconnected with a regulated POL electrically coupled with a substrate and die package, and a cold plate interposed between the regulated POL and the substrate and die package. Power is transmitted from the regulated POL to the substrate and die package through the cold plate.

In another embodiment, an apparatus generally comprises a cold plate comprising an upper surface configured for receiving a point-of-load (POL) module and a lower surface configured for attachment to a substrate having at least one die attached thereto, and a power delivery block inserted into the cold plate and comprising at least one power via for delivering power from the POL module to the die attached to the substrate.

In yet another embodiment, a method generally comprises inserting a power delivery block into a cold plate, the power delivery block comprising an electrical path extending from a first surface of the cold plate to a second surface of the cold plate, attaching a point-of-load (POL) module to the first surface of the cold plate, and attaching a substrate to the second surface of the cold plate, wherein a die is attached to an opposite side of the substrate. Power is distributed from the POL module to the die through the power delivery block in the cold plate.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

A power distribution system may be configured to deliver power from a point-of-load (POL) to an ASIC (Application-Specific Integrated Circuit) or other integrated circuit. As power requirements increase, additional thermal considerations may be needed. In package optic applications may present additional challenges. For example, fiber and copper attachments (FAU (Fiber Attachment (Array) Unit), CAU (Copper Attachment (Array) Unit)) may introduce clearance requirements impacting cooling solutions.

The embodiments described herein provide a power delivery and cooling arrangement with a substrate positioned adjacent to one side of a cold plate and POL components placed on opposite side of the cold plate. As described in detail below, electrical paths are formed in the cold plate to allow power to pass from the POL to electronic components (die, integrated circuit, ASIC, chip) coupled to the substrate. The cold plate may comprise, for example, a power delivery block (e.g., PCB (Printed Circuit Board)) with one or more power vias for transferring power through the cold plate. In another example, the cold plate may comprise a power component (e.g., regulated POL) for transferring power through the cold plate.

In one or more embodiments, an apparatus comprises a POL power supply comprising a fixed POL interconnected with a regulated POL electrically coupled with a substrate and die package, and a cold plate interposed between the regulated POL and the substrate and die package. Power is transmitted from the regulated POL to the substrate and die package through the cold plate. If additional cooling is needed, the substrate and die package may be positioned between two cold plates. In one or more embodiments, high amounts of current (e.g., ≥500 amps, ≥1000 amps) are transferred into the substrate and die package, thereby allowing for improved efficiency.

The embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, power sourcing equipment, powered devices, or other network devices), which facilitate passage of data within the network. One or more of the network devices may comprise one or more power distribution systems described herein. The network device may further include any combination of memory, processors, power supply units, and network interfaces.

Referring now to the drawings, and first to FIG. 1, a block diagram illustrating an example of power distribution through a POL power supply located on a board 10 is shown, in accordance with one embodiment. Power is delivered at element 12 to a plurality of POLs (POL modules (circuits), power components) 14a, 14c, 14d, 14e. In one example, pulse power at a voltage greater than 100V (e.g., 108V, 380V) or any other suitable voltage, is delivered to the fixed POL 14a. The power source 12 may also deliver pulse power to POLs 14c, 14d, and 14e (e.g., fixed POLs). In another example, the power source 12 delivers 54 VDC (or any other suitable voltage (e.g., intermediate bus voltage level selected based on overall system efficiency, routeability, and cost)) to POL modules 14c, 14d, 14e. The fixed POL 14a transfers power (e.g., at 54 VDC or other voltage) to the regulated POL (POL converter, POL regulator) 14b, which distributes power to ASICs 16 (e.g., integrated circuit, die, chip, multi-chip module, and the like). As described below, the fixed POL 14a may be connected to the regulated POL 14b through a bus bar interconnect or any other suitable electrical connection. The regulated POL 14b may provide, for example 150 amp or greater output. Each power connection may include 10 Mbps (or any other data rate) communications, for example. In the example shown in FIG. 1, power is delivered from the regulated POL module 14b to the ASICs 16 via a voltage rail. Power may be provided to the ASICs 16 in a multi-drop arrangement, for example.

It is to be understood that the term "POL module" as used herein may refer to various types of POL configurations, including, for example, discrete POLs and modules or power delivery block based voltage regulator designs. Also, it may be noted that the POLs may be single phase or multi-phase POLs that may work together to deliver one or more output.

System components (POL modules, cold plates, electronic package (substrate and die package)) are connected to the board 10. The board 10 may comprise a printed circuit board or the components may be directly attached to sheet metal modules, a line card, or any other suitable support member. For example, a line card circuit board may be removed and the electronic package interconnected through fiber and copper connections at the ASIC edge.

As previously noted, pulse power may be supplied to one or more of the POL modules. The term "pulse power" (also referred to as "pulsed power") as used herein refers to power that is delivered in a plurality of voltage pulses (sequence of voltage pulses) 18 in which voltage varies between a very small voltage (e.g., close to 0V, 3V) during a pulse-off time 19a and a larger voltage (e.g., ≥12V) during a pulse-on time 19b. High voltage pulse power (high voltage pulses) (e.g., >56V, ≥60V, ≥300V) may be transmitted from power sourcing equipment (PSE) to a powered device (PD) for use in powering the powered device, whereas low voltage pulse power (low voltage pulses) (e.g., ~12V, ~24V, ≤30V, ≤56V) may be used over a short interval for start-up (e.g., initialization, synchronization, charging local energy storage, powering up a controller, testing, or any combination thereof). The pulse power may also be delivered in multiple phases, with the pulses offset from one another between phases to provide continuous power. Pulse power transmissions may be through cables, transmission lines, bus bars, backplanes, PCBs, and power distribution systems, for example.

It is to be understood that the voltage, power, and current levels described herein are only provided as examples and power may be delivered at different levels (volts, amps, watts) than described herein without departing from the scope of the embodiments. Also, power may delivered as ESP (Extended Safe Power) (e.g., pulse power, multi-phase pulse power, pulse power with fault detection and safety protection), PoE (Power over Ethernet), or in accordance with any current standard or future standard.

Figure 2:
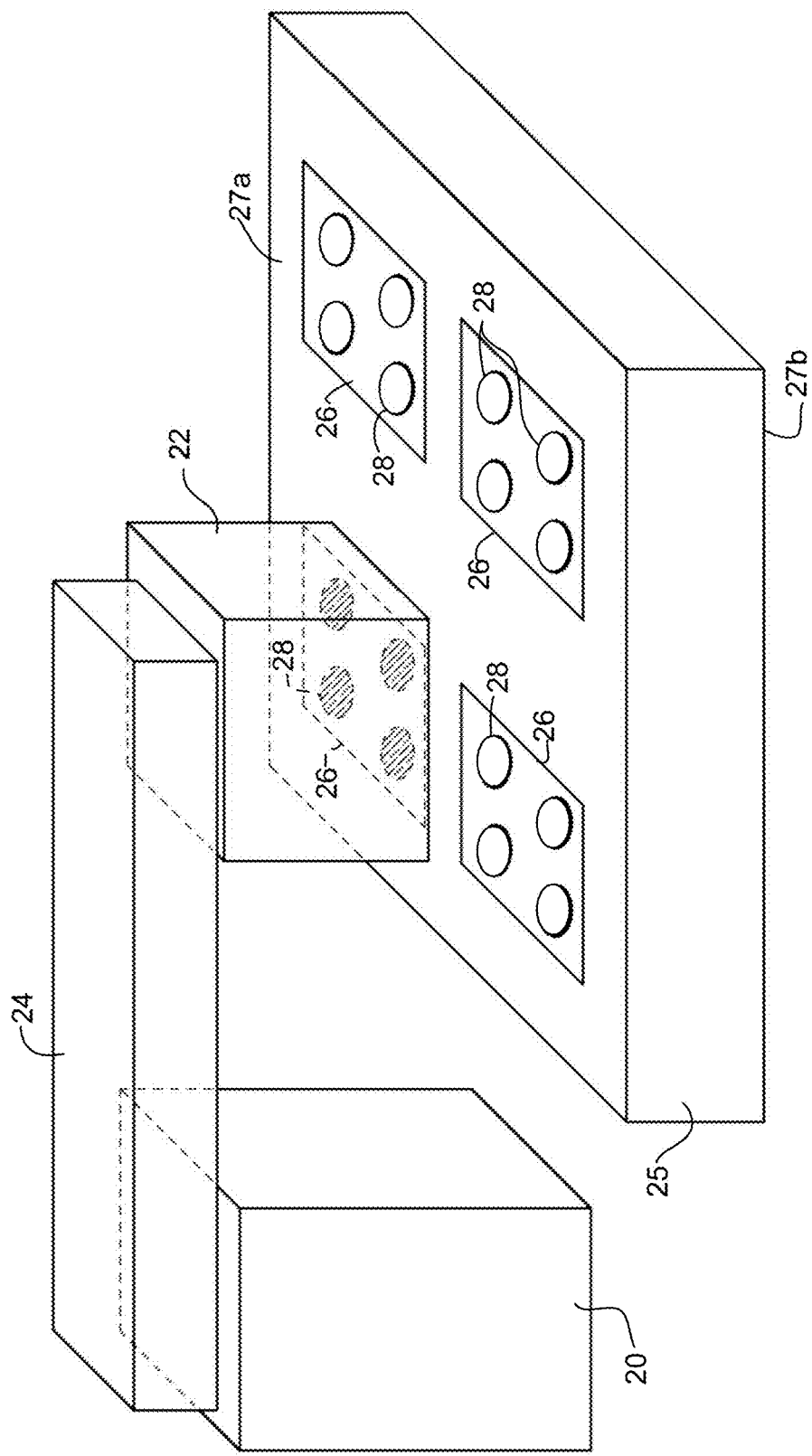
FIG. 2 is a schematic perspective of the POL modules and a cold plate comprising power delivery blocks with power vias for delivery of power from the POL modules, in accordance with one embodiment.

FIG. 2 is a perspective schematic illustrating a connection between a fixed POL 20 and a regulated POL 22, and distribution of power through a cold plate 25, in accordance with one embodiment. The fixed POL module 20 may provide input power to the regulated POL module 22 via an electrical connection 24 comprising, for example, a bus bar, wire, or other interconnect. For simplification, only one POL module 22 is shown connected to the cold plate 25, however, any number of POL modules may be connected to the cold plate. Each POL may provide a single voltage rail or multiple voltage rails, as shown in FIG. 1.

As shown in FIG. 2, the cold plate 25 comprises a plurality of power delivery blocks 26 each comprising a plurality of power vias (electrical paths) 28 for transmitting power through the cold plate, from the POL module 22 to an electronic package (substrate and die package) (described below with respect to FIG. 4). Power is transmitted from a first side (e.g., upper surface 27a as shown in FIG. 2) to a second side (e.g., lower surface 27b as shown in FIG. 2) of the cold plate 25 opposite and generally parallel to the first side. In one or more embodiments, the power delivery block 26 comprises a small (miniature) power printed circuit board. Based on the application, other components may also be inserted into the cold plate 25 or strategically placed cutouts may also be used.

It should be noted that the terms lower, upper, bottom, top, below, above, horizontal, vertical, and the like, which may be used herein are relative terms dependent upon the orientation of the package and components and should not be interpreted in a limiting manner. These terms describe points of reference and do not limit the embodiments to any particular orientation or configuration.

The power delivery block 26 comprises a plurality of through holes (vias) 28, which extend through the entire thickness of the power delivery block (as shown in phantom in FIG. 3) and are plated along their interior surfaces. The through hole may, for example, be created using a drilling process and plated with a metallic material (e.g., copper or any conductive or metallic layer). The plating may effectively cover the barrel of the hole and create the electrical path through the cold plate 25.

The term "power delivery block" as used herein may refer to any block of thermal and conductive material in which electrical paths (e.g., power vias) may be formed to allow for the passage of power directly through the cold plate 25. Although the term "printed circuit board" is used herein as an example of a substrate for the power delivery block 26, in other implementations the PCB may be replaced with other substrates (e.g., ceramic circuit boards) or other elements. Also, non-printed circuit boards may be used for the power delivery block 26. For example, a piece of glass may be laser patterned with waveguides and plated with metal vias to form a combined optical path and electrical path. Also, as previously noted other components in addition to or instead of the PCB may be inserted into the cold plate.

Figure 11:
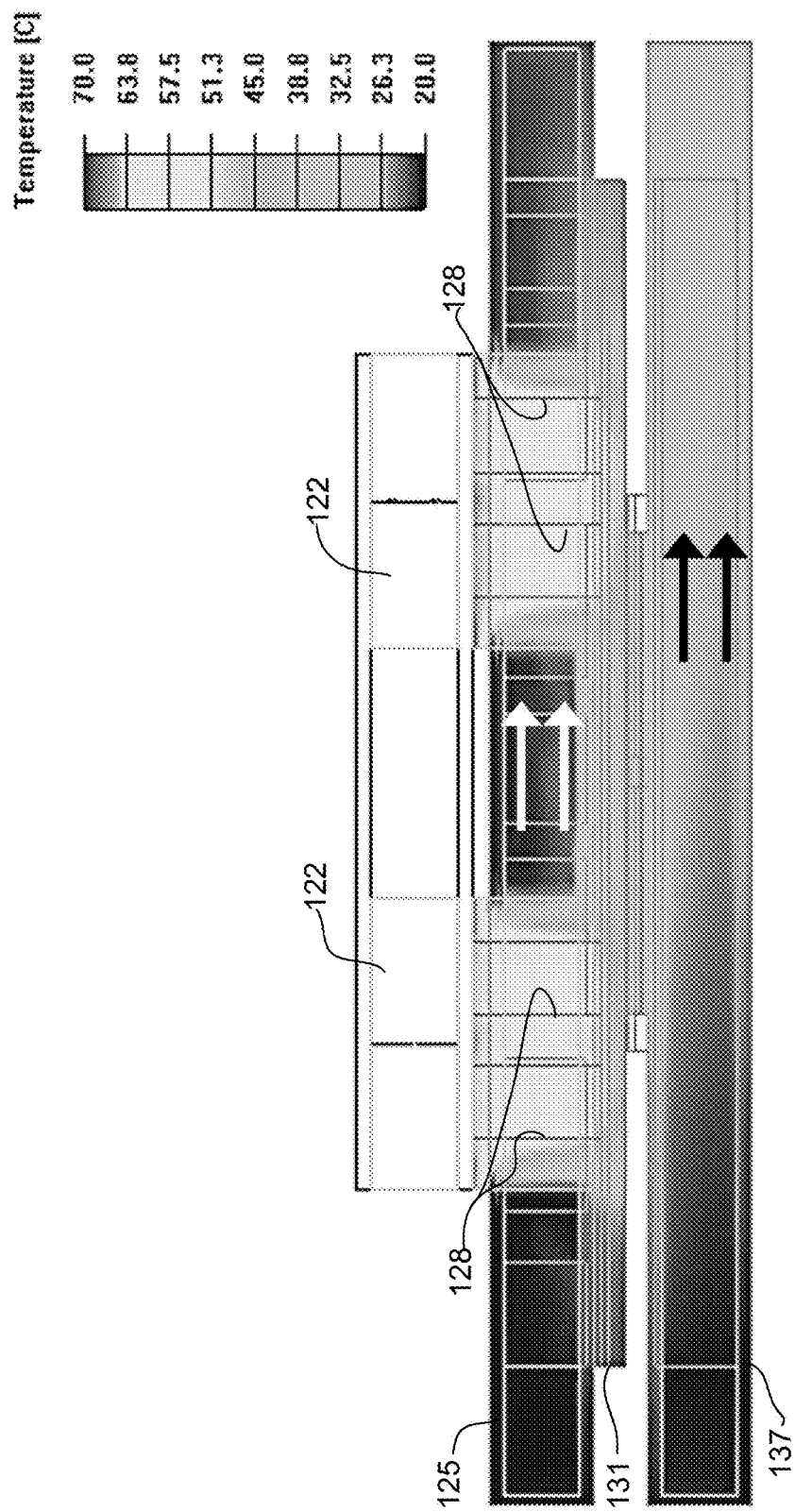
FIG. 11 is a side view illustrating an example of a temperature distribution through the cold plates, in accordance with one embodiment.

The cold plate 25 may comprise, for example, liquid, gas, or multi-phase (multi-phase cold plate) based cooling. The through power vias 28 may deliver 10 amps per tube, for example, and may be cooled by the cold plate 25. In one or more embodiments, the cold plate 25 is formed with one or more openings for insertion of one or more power delivery blocks 26, which may be, for example, press fit into the cold plate 25. An epoxy resin or adhesive fill may be used to press and position the power delivery block 26 within the cold plate 25. The epoxy resin may be used to account for tolerances between the power delivery block 26 and cold plate opening. If the cold plate 25 utilizes cooling tubes or reservoirs, these are routed or positioned around the power delivery block openings. The cold plate 25 keeps a temperature rise low for the power vias 28, thereby maximizing current transfer from the POL 22 to the substrate and die package. In one example, the cold plate 25 is configured with multiple internal zones to maintain optical temperature below 75 degrees Celsius. An example of a temperature distribution through the cold plates is shown in FIG. 11 and described below. It is to be understood that the cold plate and temperatures described herein are only examples and other designs may be used to maintain cooling at different temperatures.

Figure 3:
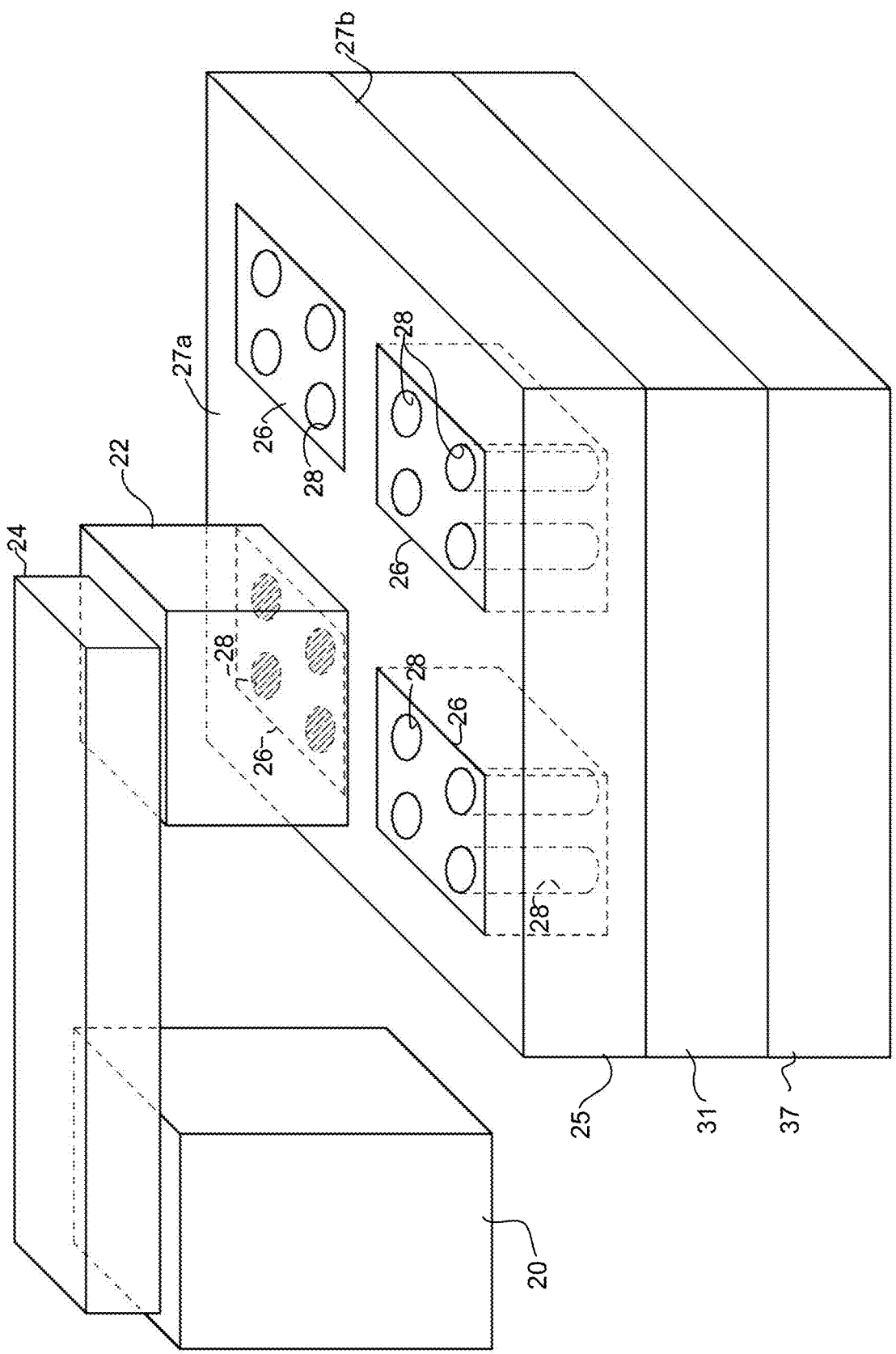
FIG. 3 is a schematic perspective of the POL modules and cold plate of FIG. 2 with a substrate and die package interposed between two cold plates, in accordance with one embodiment.

As shown in FIG. 3, the power delivery blocks 26 and vias 28 formed therein extend through the cold plate 25 to provide power to an attached electronic package (substrate and die package) 31. For simplification, only a portion of the power delivery blocks 26 and vias 28 are shown in phantom extending through the cold plate 25. Also, the electronic package 31 is shown as a single block structure, but it is to be understood that the package may comprise one or more substrates with any number of components (integrated circuit, ASIC, die, chip, chiplet, optical engine, FAU/CAU) attached thereto, as described below with respect to FIG. 4.

Figure 4:
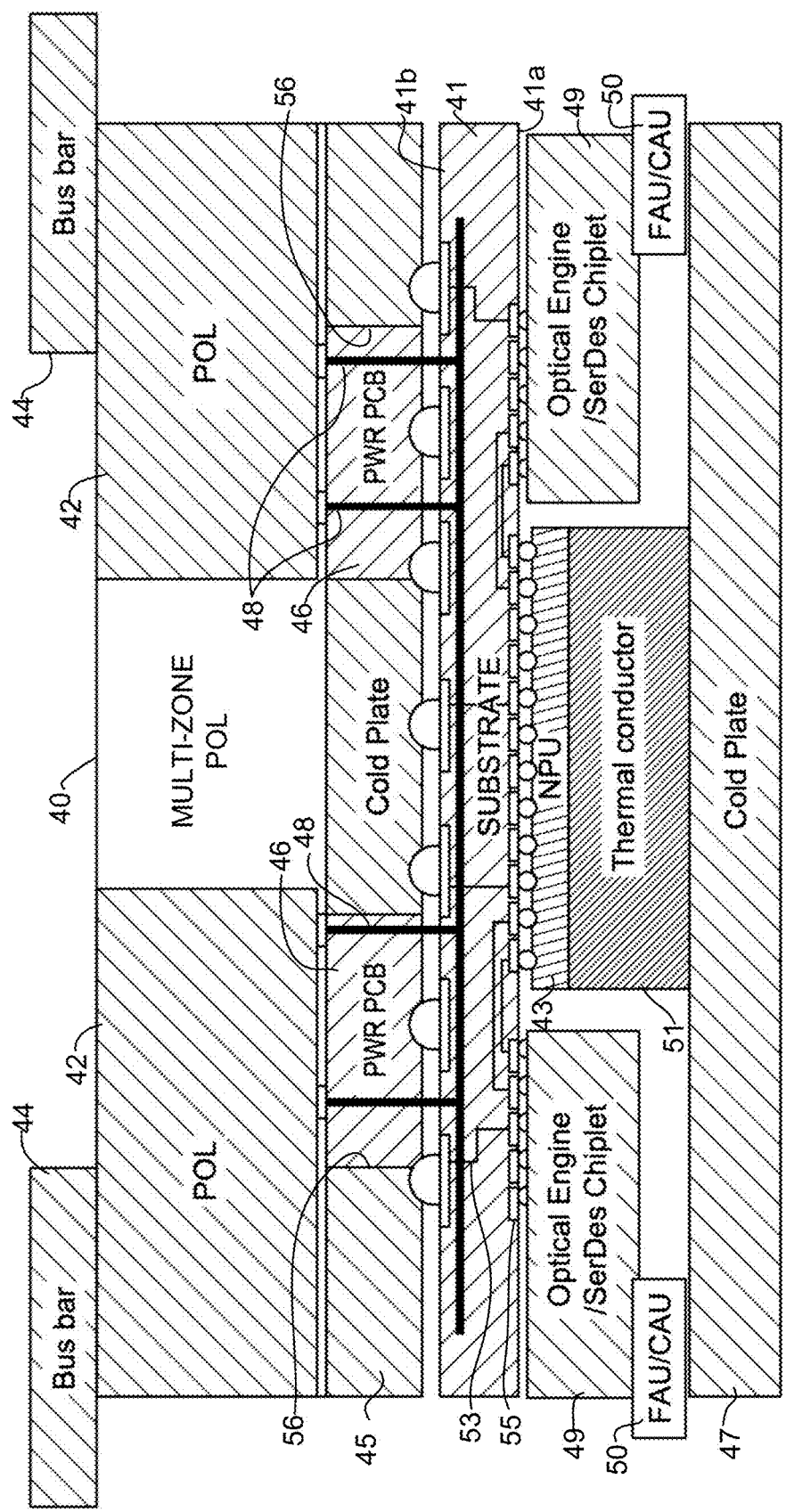
FIG. 4 is a cross-sectional schematic of the components shown in FIG. 3 illustrating additional detail, in accordance with one embodiment.

In one or more embodiments, an apparatus comprises the cold plate 25 having an upper surface 27a configured for receiving the point-of-load (POL) module 22 and a lower surface 27b configured for attachment to a substrate having at least one die attached thereto (as shown in FIG. 4 and described below), and the power delivery block 26 inserted into the cold plate and comprising the power via 28 for delivering power from the POL module to the die attached to the substrate.

In one or more embodiments, an additional cold plate 37 may be used, with the electronic package 31 interposed between the two cold plates 25, 37 to provide additional cooling to the electronic package. It may be noted that use of the second cooling plate 37 is optional based on power and cooling requirements. Although a second cooling plate is not shown in the examples of FIGS. 5, 6, 7, and 8, a second cooling plate may also be used.

Also, it is to be understood that the cold plate may comprise any number of individual cold plates. For example, the cold plate 25 may comprise two or more smaller cold plates with one or more of the power delivery blocks or electrical paths interposed therebetween.

Referring now to FIG. 4, a cross-sectional schematic illustrates an apparatus comprising a substrate 41 having a first surface 41a and a second surface 41b opposite to the first surface, an integrated circuit (one or more die (chip)) 43 attached to the first surface of the substrate, and a cold plate 45 attached to the second surface of the substrate and comprising an electrical path (e.g., power via) 48 extending therethrough for transmitting power from a power component (e.g., POL module) 42 to the integrated circuit. The term "substrate" as used herein may refer to an electrical board, ceramic board, or an element formed from any other suitable material.

Bus bars 44 are shown connected to a multi-zone POL 40 (e.g., with DC power to rail voltage) with POL modules 42 attached to the cold plate 45 configured to distribute power from the POL modules to an electronic package comprising the substrate 41 and the integrated circuit 43 (ASIC, NPU (Network Processing Unit), die, chip) and two optical engines (photonic chips) 49 (SerDes (Serializer/Deserializer) chiplet) attached thereto. The electronic package (also referred to herein as a substrate and die package) may comprise one or more integrated circuit, ASIC, NPU, MCM, die, chip, chiplet, processor, or electronic component attached to one or more substrates. In the example of FIG. 4, the substrate and die package includes the substrate 41, NPU 43, optical engines 49 and FAU/CAU 50. It is to be understood that this is only an example and the substrate and die package may include any number of components in any arrangement. The FAU/CAU 50 may be attached to a lower surface of the optical engine 49 (as shown in FIG. 4) or positioned on an upper surface or side of the optical engine 49. In the example of FIG. 4, a second cold plate 47 is thermally coupled to the NPU 43 through a thermal conductor (interposer) 51. The thermal conductor (or a plurality of thermal conductors) may be positioned across multiple die. One or more embodiments may also include an optional lid between the multi-chip module and the cold plate 47.

As previously described, the cold plate 45 includes one or more power delivery blocks 46 (e.g., PWR PCB) inserted into the cold plate, with one or more electrical paths (power vias) 48 formed therein. In one or more embodiments, the power delivery blocks 46 are formed separately from the cold plate 45 and inserted into openings 56 formed in the cold plate for receiving the blocks. As discussed above, an epoxy resin or adhesive fill may be used to press and position the power delivery blocks within the openings 56 in the cold plate 45.

The substrate 41 may comprise traces 53 and pads 55 embedded within or deposited on the substrate for connection with the power vias 48 and die 43. Etching, deposition, bonding, or other processes may be used to form the traces and pads, as is well known by those skilled in the art. The substrate 41 may be bonded to the cold plate 45 using solder processes, as well known by those skilled in the art.

In one example, the entire assembly shown in FIG. 4 may have a height of less than 50 mm. For example, the POL modules 42 may have a height of approximately 15 mm to 20 mm, the cold plates 45, 47 may each have a height of approximately 5 mm to 8 mm and the optical engine 49 may have a height of approximately 2 mm to 3 mm. The package may be, for example 70 mm×70 mm or larger. It is to be understood that these dimensions and the components and arrangement shown in FIG. 4 are only examples and other types or number of components with different sizes and arrangement, or additional components may be used without departing from the scope of the embodiments. For example, one or more integrated circuits may be positioned on an upper surface of the cold plate 45 (side opposite the substrate 41).

Figure 5:
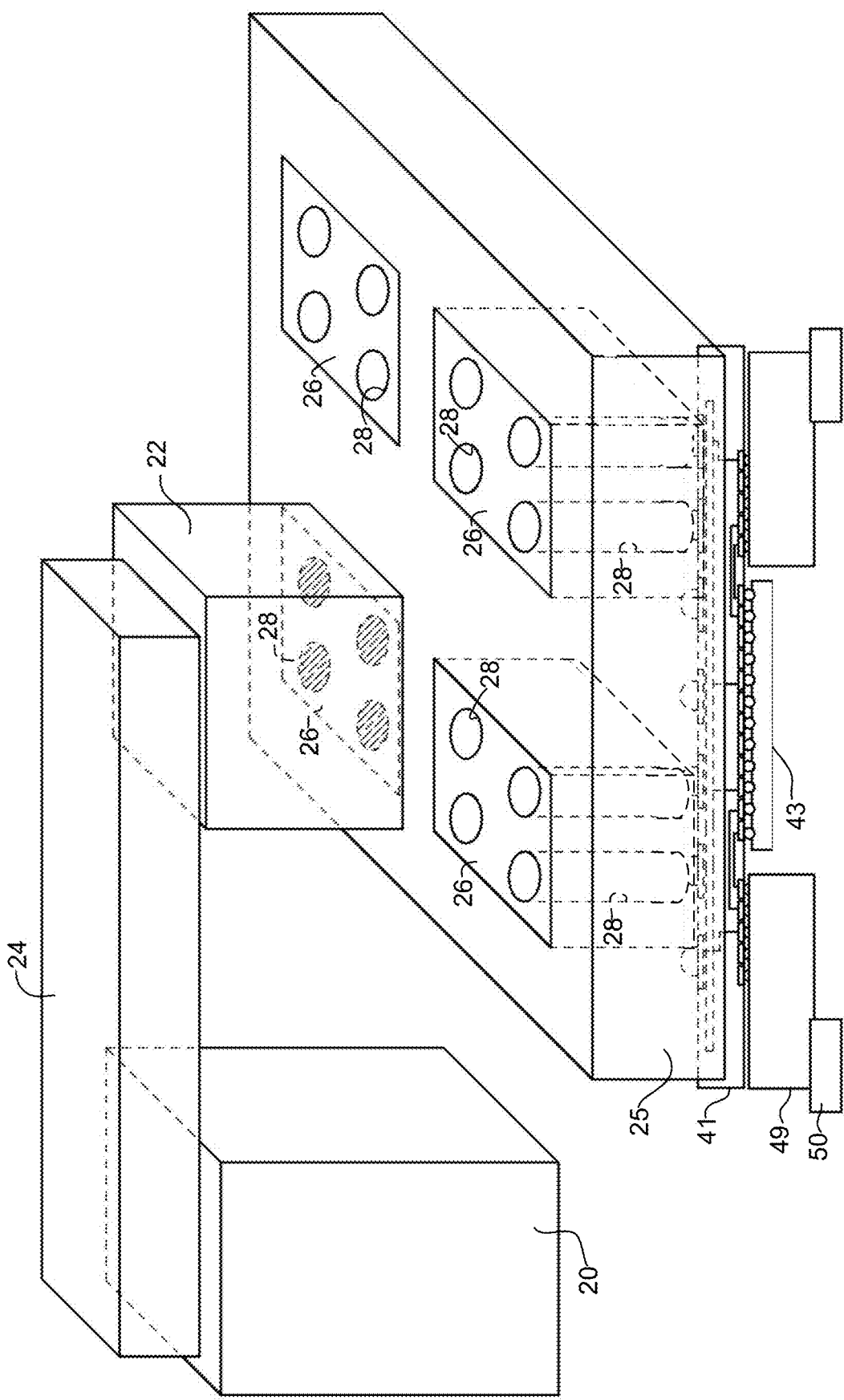
FIG. 5 schematically illustrates components of FIG. 4 attached to the cold plate of FIG. 2, in accordance with one embodiment.

FIG. 5 schematically illustrates placement of the substrate and die package (substrate 41, ASIC 43, photonic chip 49, FAU/CAU 50) below the cold plate 25 shown in FIG. 2. As previously noted, the substrate 41 may comprise any number of ASICs 43 operable to receive power from one or more POL modules 22 positioned on the upper surface of the cold plate 25 or individual substrates and die packages may be positioned below the cold plate.

In addition to passing power through the power delivery block 26, communications (e.g., control plane communications) may also pass through the power delivery block. In one or more embodiments, control communications for the regulated POL and for the ASIC to a system FPGA (Field-Programmable Gate Array) may pass through the cold plate 25 or through ribbon cables.

Figure 6:
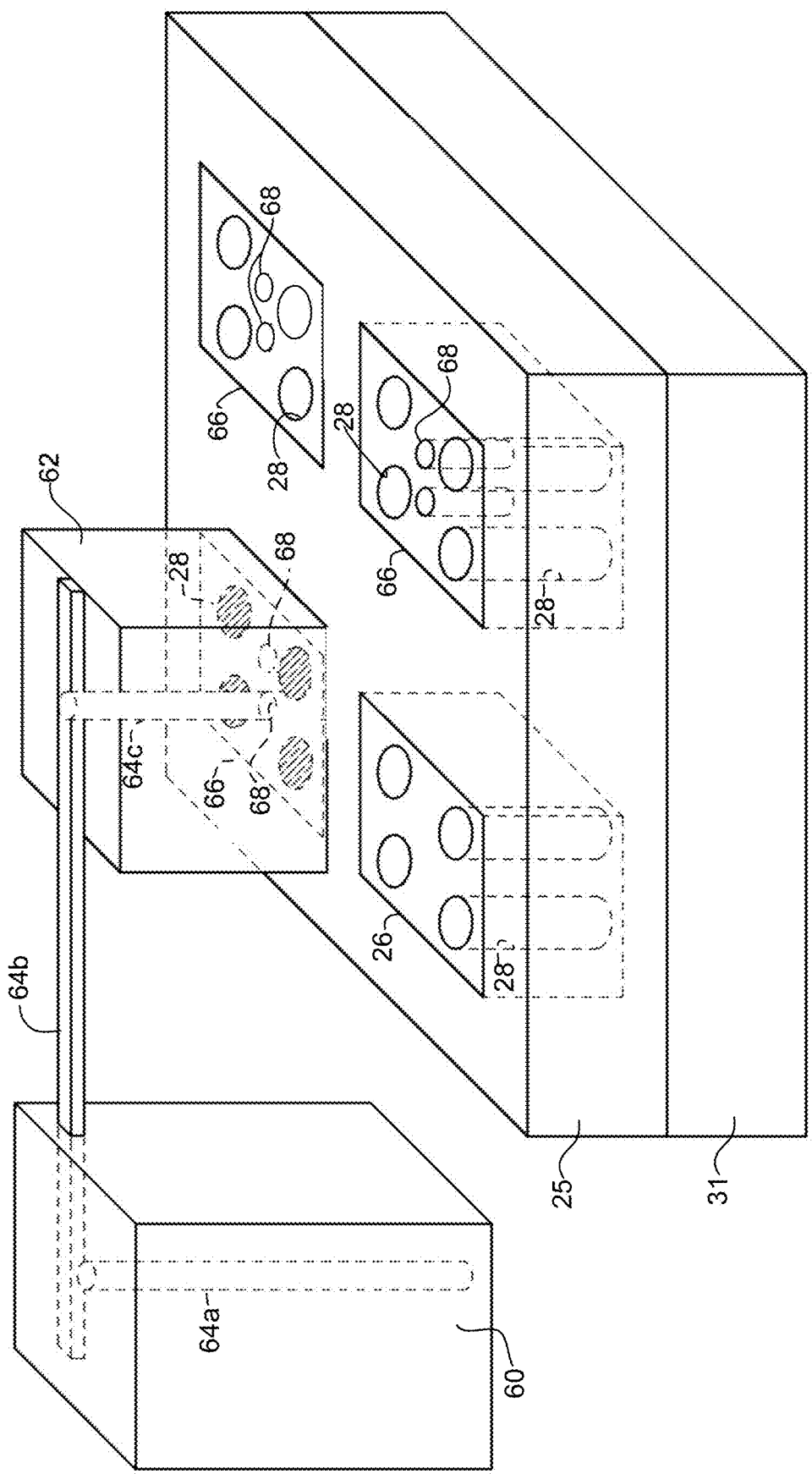
FIG. 6 illustrates control plane communications transmitted through the POL module and the cold plate, in accordance with one embodiment.

FIG. 6 illustrates an example in which control plane communications pass through the POL circuit (POL modules 60, 62 and interconnect) and through communication vias 68 formed in power delivery blocks 66 along with power vias 28. In the example shown in FIG. 6, control plane communications pass through the fixed POL over path 64*a*, over the interconnect at 64*b* and through the regulated POL 62 at 64*c*. The power delivery blocks 66 include communication vias 68 in addition to the power vias 28 to provide electrical and communication paths through cold plate 25 to substrate and die package 31. In one example, lower speed communications pass through the POL (e.g., 200 Mbps range). The cold plate 25 may include any combination of power delivery blocks with power vias, communication vias, or both power and communication vias.

Figure 7:
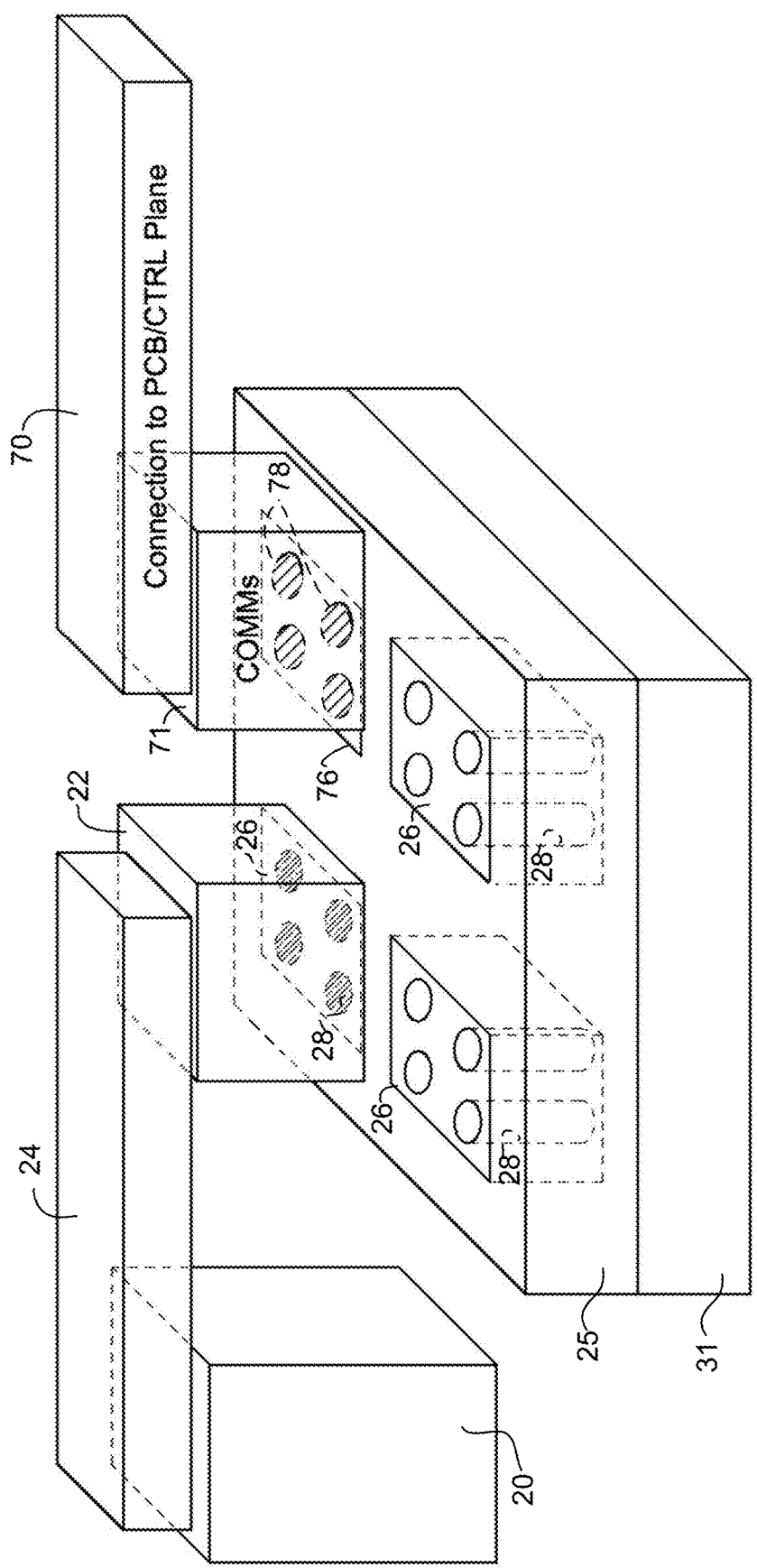
FIG. 7 illustrates control plane communications transmitted through one of the power delivery blocks in the cold plate, independent from the POL module, in accordance with another embodiment.

FIG. 7 illustrates another example in which control plane communications are provided through separate communications elements 70, 71 (e.g., via ribbon cable or other means), which may be used to move control communications in and out of the package. The communications module 71 interfaces with a communications block 76 (e.g., PCB) inserted into the cold plate 25. The communications block 76 includes one or more communications path (via) 78 formed therein. In one or more embodiments full speed PCIe (Peripheral Component Interconnect express) or faster may be used. The cold plate 25 may be connected to any number or combination of POL modules 22 and communication modules (COMMS 71).

Figure 8:
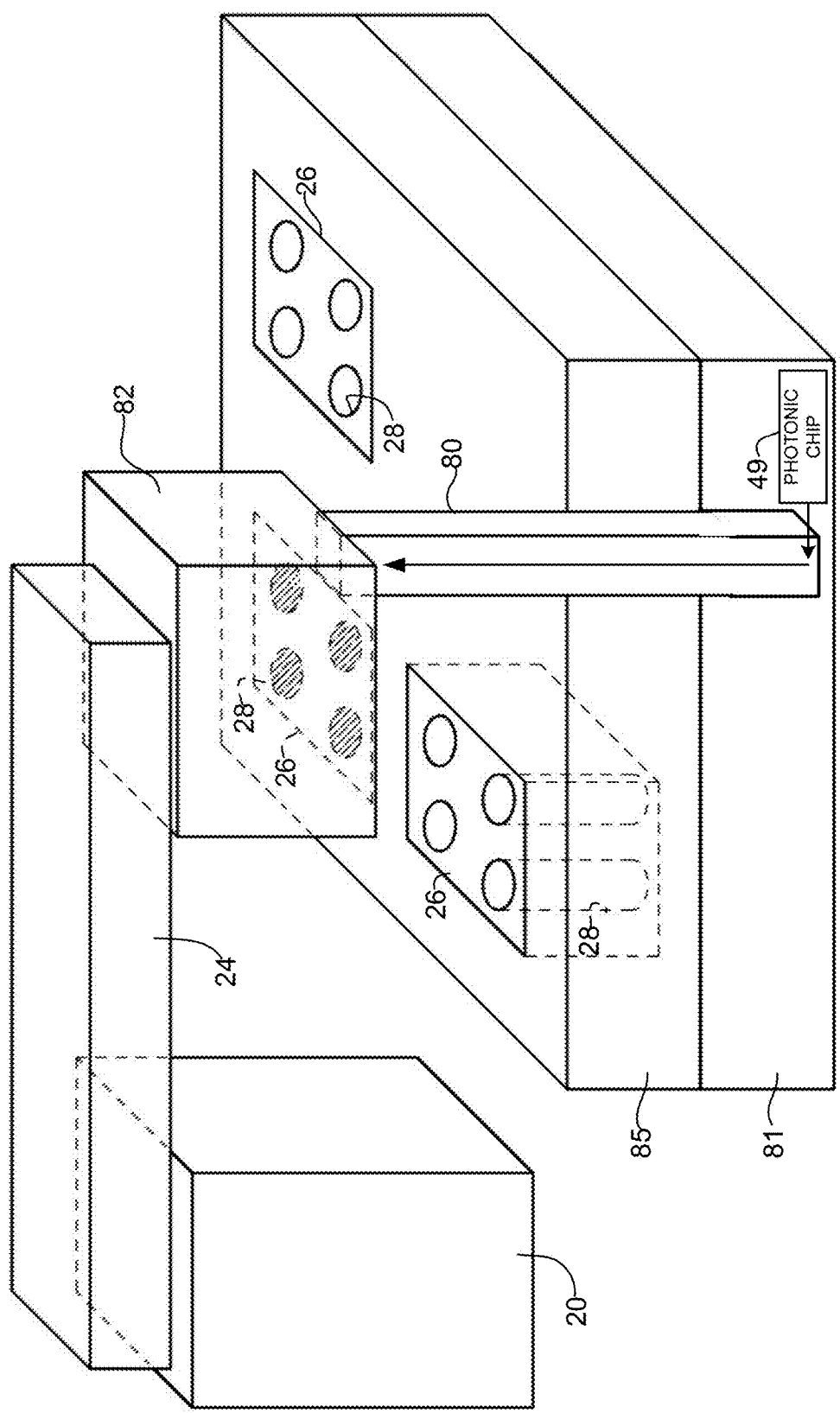
FIG. 8 illustrates optics transmitted through the cold plate, in accordance with one embodiment.

In one or more embodiments, optics may also pass through the cold plate and substrate so that both power and optics connections are at the POL and bus bar. FIG. 8 illustrates an example in which a passageway is created to allow light to pass through a cold plate 85 and package substrate to reach the optical engine (photonic die) 49. The passageway 80 may be configured for light, laser written waveguides in glass, free space optics, or optical fiber, for example. A cutout may be made in the cold plate 85 and substrate 81 with passageway 80 inserted therein to link POL module 82 and bus bar 24 to the photonics chip 49. The passageway 80 may comprise, for example, one or more waveguides defining an optical assembly or an opening for receiving fiber optics. The passageway structure 80 may be aligned and exposed to the photonics die 49 and power bridge (power components) as shown in FIG. 8, or may interconnect through a connector with interlocking features, for example. The passageway 80 may be attached to the die using active or passive alignment processes and adhesive, such as an index matching epoxy, for example. Also, as previously noted the optical path may be combined with the electrical path. For example, a piece of glass may be laser patterned with waveguides and plated with metal vias to form a combined optical path and electrical path. Also, more than one passageway 80 may be formed in the cold plate 85 and substrate 81 to communicate with one or more photonic die 49.

In one or more embodiments, the passageway structure 80 for the optics may be part of a dedicated cutout for the optical path separate from the electronics. For example, similar to the embodiment described above for the communications in FIG. 7, one or more of the power delivery blocks 26 may be replaced with an optics passageway structure.

Figure 9:
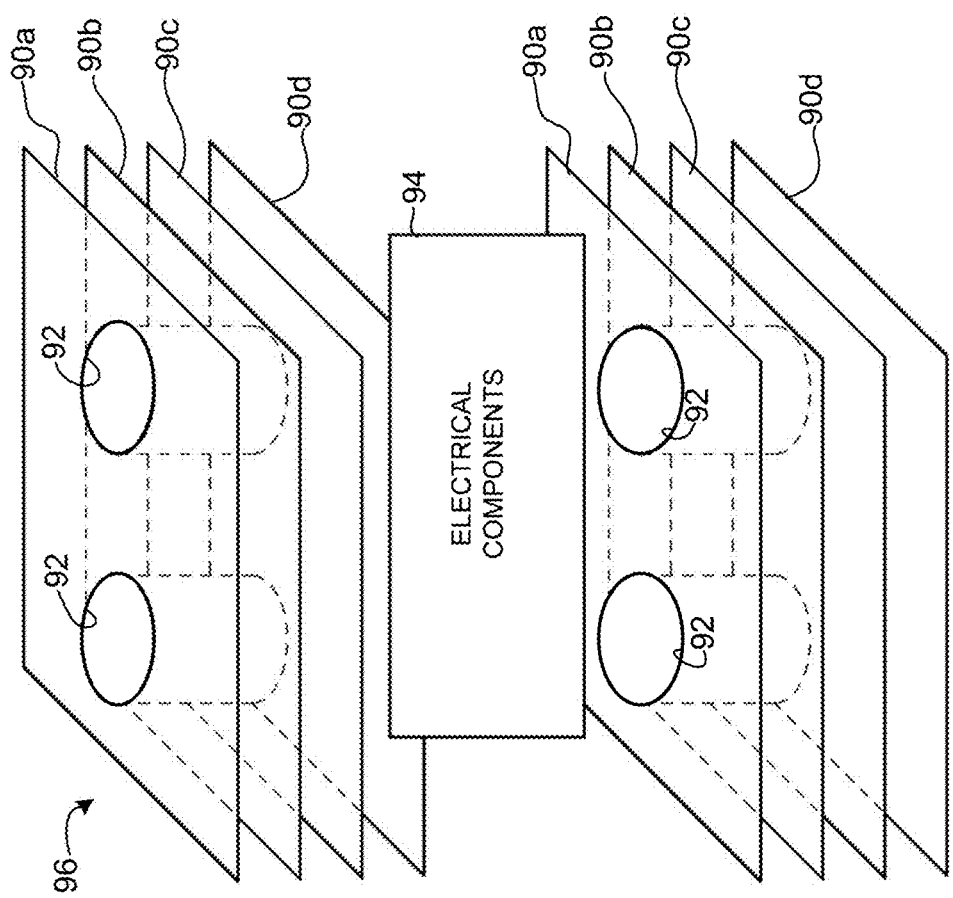
FIG. 9 illustrates details of the power delivery block, in accordance with one embodiment.

FIG. 9 is a perspective schematic of a power delivery block 96, in accordance with one embodiment. As previously described, the power delivery block 96 may comprise a printed circuit board or other substrate comprising multiple layers 90a, 90b, 90c, 90d. The inner plane layers 90b, 90c may provide greater current density. Planes may be added to provide power filter shapes to provide LC (inductor (L), capacitor (C)) filtering in the power delivery structure. In the example shown in FIG. 9, two PCBs are used with components 94 interposed therebetween (e.g., capacitors, inductors, POL components, FET (Field-Effect Transistor) controller, and the like). It is to be understood that the power delivery block may include any number of layers, a single block, multiple blocks with components installed therebetween, and any number of vias 92 for power or communications.

Figure 10:
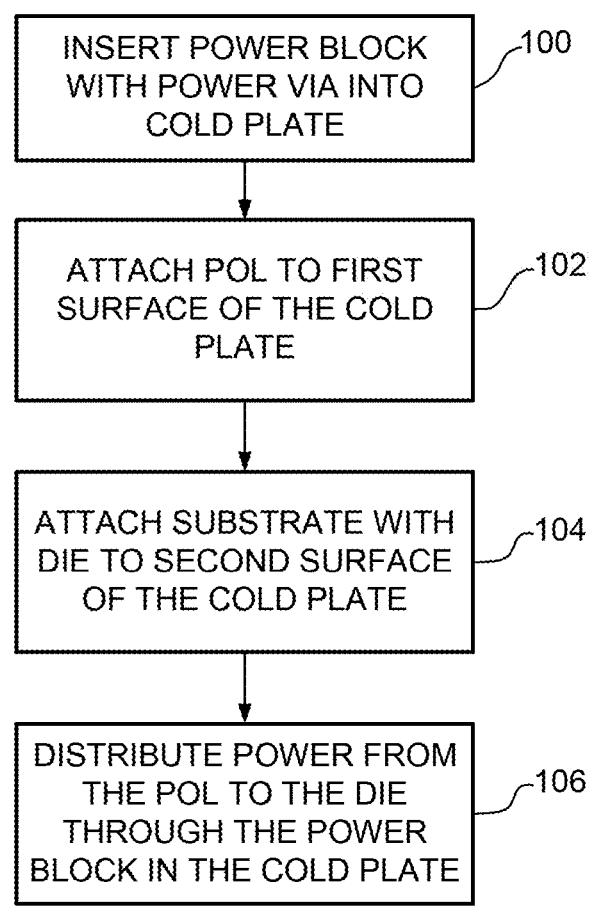
FIG. 10 is a flowchart illustrating an overview of a process for implementing a power distribution system for delivering power from the POL module through the cold plate, in accordance with one embodiment.

FIG. 10 is a flowchart illustrating an overview of a process for implementing the power distribution and cooling system, in accordance with one embodiment. At step 100, the power delivery block 46 is inserted into the cold plate 45 (FIGS. 4 and 10). As previously described, the power delivery block may comprise a PCB or other substrate with one or more electrical paths (power vias) extending therethrough. The power delivery block 46 may be press into the cold plate 45 and secured in place with an epoxy resin or adhesive fill, for example. The POL module 42 is attached to a first surface (upper surface in FIG. 4) of the cold plate (step 102) and the substrate 41 with the die 43 is attached to a second surface (lower surface in FIG. 4) of the cold plate (step 104). Power is distributed from the POL module to the die through the power delivery block in the cold plate (step 106).

It is to be understood that the process shown in FIG. 10 and described above is only an example and steps may be added, modified, combined, or reordered without departing from the scope of the embodiments. For example, if an optical passageway 80 is used, the passageway may be attached to the die/optical engine first.

FIG. 11 is a side view illustrating an example of a temperature distribution through the cold plates, in accordance with one embodiment. POL modules 122 are mounted on a first cold plate 125 comprising power vias 128, as previously described. A substrate and die package 131 is positioned on an opposite side of the first cold plate 125 and interposed between the first cold plate 125 and a second cold plate 137. As previously described, a thermal conductor may be positioned between the die and the second cold plate 137. Flow direction through the cold plates 125 and 137 is indicated by arrows on the cold plates. The temperature distribution example shown in FIG. 11 is for an inlet temperature of 20 degrees Celsius and a flow rate of 5.0 LPM (2×2.5 LPM) with an 1800 W package.

Figure 12:
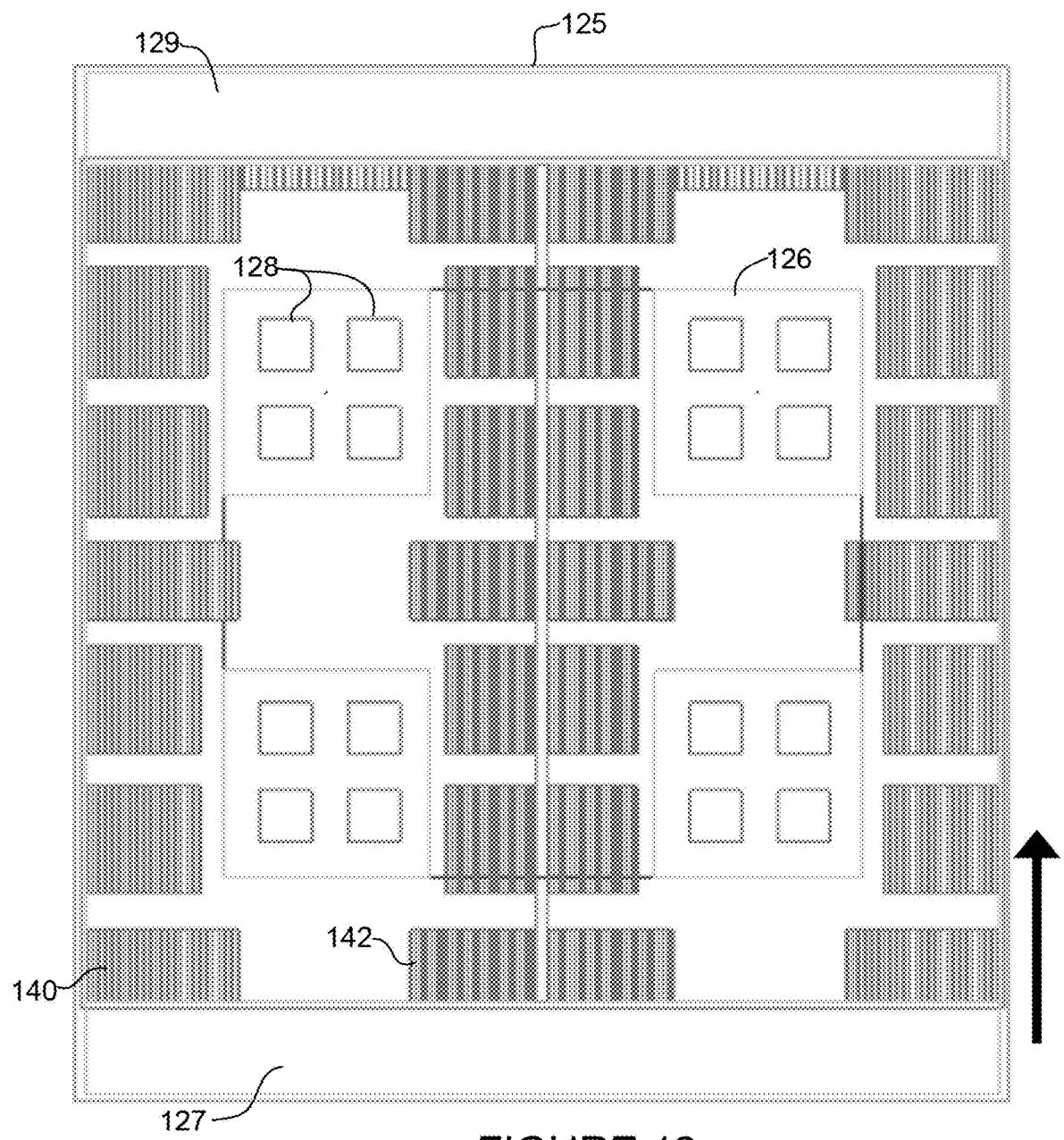
FIG. 12 is a plan view of the cold plate and power delivery blocks in accordance with one embodiment.

FIG. 12 is a plan view of the cold plate 125 and power delivery blocks 126, in accordance with one embodiment. Flow direction is from an inlet manifold 127 to an exhaust manifold 129, as indicated by the arrow. Four power delivery blocks 126 with power vias 128 are inserted into the cold plate 125. In one example, the cold plate 125 has a variable fin density to obtain uniform flow at a given cross section. For example, the cold plate 125 may include low density fin columns 140 along outer edges and high density fin columns 142 along a central portion of the cold plate. In one example, the second cold plate 137 (FIG. 11) may have a uniform fin density. Fin pitch, thickness, number of fins, and manifold channel dimensions may be optimized to minimize pressure drop and obtain nearly uniform flow for both cold plates.

Figure 13:
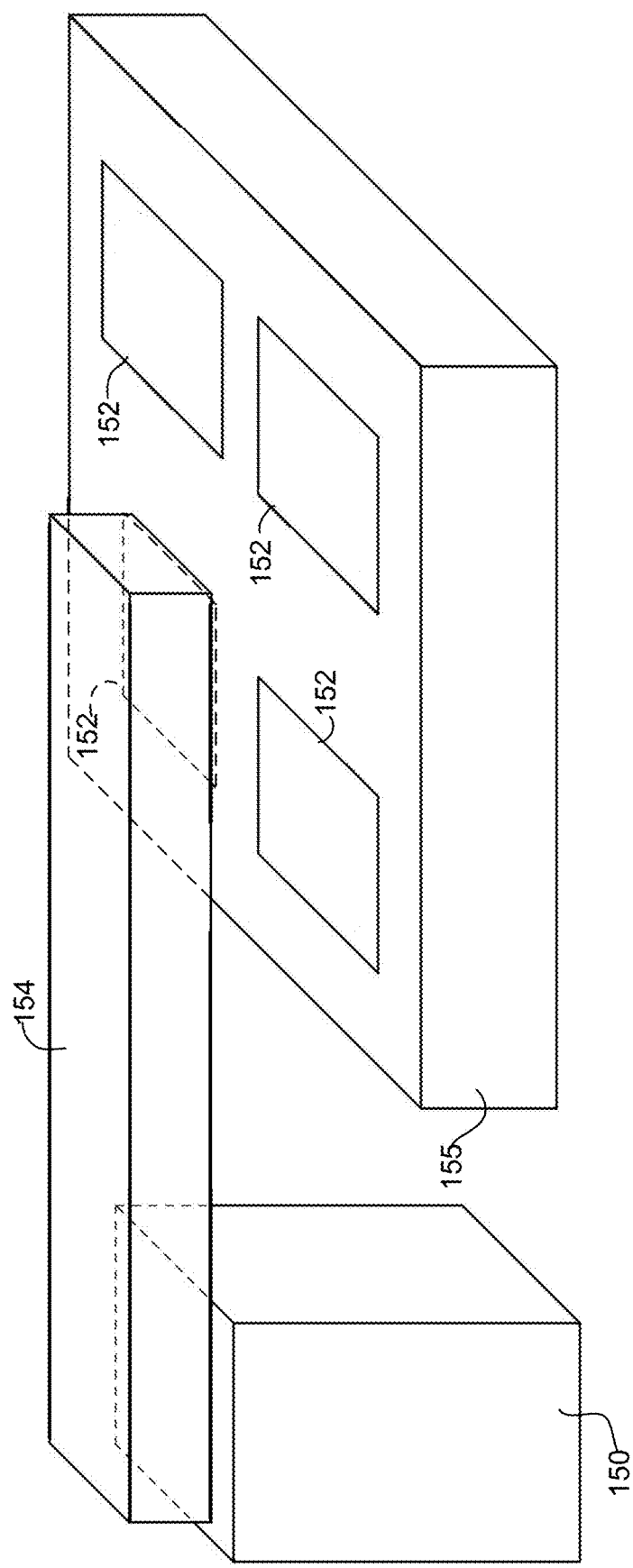
FIG. 13 is a schematic perspective of a cold plate with regulated POL modules inserted into the cold plate, in accordance with one embodiment.

FIG. 13 illustrates another embodiment of the power distribution system. In the example shown in FIG. 13, regulated POL modules 152 are inserted directly into openings formed in a cold plate 155. The regulated POL modules 152 may each be connected to a fixed POL module 150 for delivering power from the fixed POL to the substrate and die package attached to an opposite side of the cold plate (not shown), as previously described. In this embodiment, the regulated POL module 152 defines an electrical path from the fixed POL module 150 coupled to the regulated POL module through connection 154. A thermal interface or heat transfer path may be provided for the embedded POL module 152.

As can be observed from the foregoing, one or more embodiments described herein provide advantages over conventional systems. For example, one or more embodiments allow for high efficiency transfer of high amounts of current into an electronic package (e.g., ≥1000 amps). In one or more embodiments, the arrangement of the cold plate (or cold plates), substrate, and die allow for improved thermal efficiency. The power delivery block inserted into the cold plate allows for cooling of the power vias while providing an electrical passageway from the power component to the integrated circuit directly through the cold plate.

Although the apparatus and method have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
    a substrate comprising a first surface and a second surface opposite to said first surface;
    an integrated circuit attached to said first surface of the substrate; and
    a cold plate attached to said second surface of the substrate with an electrical path extending through the cold plate for transmitting power from a power component connected to the cold plate, to the integrated circuit, wherein the power component comprises a regulated point-of-load (POL) module interconnected with a fixed POL module via an electrical connection.

2. The apparatus of claim 1, wherein the cold plate comprises a plurality of electrical paths for transmitting the power from the power component to the integrated circuit.

3. The apparatus of claim 1, wherein the substrate and the integrated circuit comprise a multi-chip module.

4. The apparatus of claim 1, wherein the integrated circuit comprises an ASIC (Application-Specific Integrated Circuit) operable to perform network processing functions and wherein at least one optical engine is attached to the substrate.

5. The apparatus of claim 1, further comprising a second cold plate and a thermal interposer positioned between said second cold plate and the integrated circuit.

6. The apparatus of claim 1, wherein the cold plate comprises a power delivery block inserted into the cold plate, said electrical path extending through the power delivery block.

7. The apparatus of claim 6, wherein the power delivery block comprises a printed circuit board and said electrical path comprises a power via formed in the printed circuit board.

8. The apparatus of claim 7, wherein the power is transmitted through the power via at a current of at least 10 amps.

9. The apparatus of claim 1, wherein the cold plate comprises a plurality of printed circuit boards inserted into the cold plate, each of the printed circuit boards comprising at least one power via forming said electrical path.

10. The apparatus of claim 1, wherein the power component is configured for receiving pulse power.

11. The apparatus of claim 1, wherein at least one component on the substrate is coupled to fiber and copper connections.

12. The apparatus of claim 1, wherein the cold plate further comprises a communication path for transmitting communications through the cold plate.

13. The apparatus of claim 1, wherein the cold plate and the substrate further comprise openings for transmitting optics through the cold plate and the substrate.

14. The apparatus of claim 1, wherein the regulated POL module is located within the cold plate and coupled to the fixed POL module for delivering the power from the fixed POL module to the integrated circuit.

15. An apparatus comprising:
a point-of-load (POL) power supply comprising a fixed POL interconnected with a regulated POL electrically coupled with a substrate and die package; and
a cold plate interposed between the regulated POL and the substrate and die package;
wherein power is transmitted from the regulated POL to the substrate and die package through the cold plate.

16. The apparatus of claim 15, wherein the cold plate comprises a plurality of electrical paths for transmitting the power from the regulated POL to the substrate and die package.

17. The apparatus of claim 15, wherein the substrate and die package comprises an ASIC (Application-Specific Integrated Circuit) operable to perform network processing functions and at least one optical engine.

18. The apparatus of claim 15, further comprising a second cold plate, wherein the substrate and die package are interposed between the cold plate and said second cold plate.

19. The apparatus of claim 15, wherein the cold plate comprises a power delivery block inserted into the cold plate and wherein the power is transmitted through a power via in the power delivery block.

20. The apparatus of claim 16, wherein the fixed POL is operable to receive pulse power.

21. An apparatus comprising:
a cold plate comprising an upper surface configured for receiving a point-of-load (POL) module and a lower surface configured for attachment to a substrate having at least one die attached thereto; and
a power delivery block inserted into the cold plate and comprising a power via for delivering power from the POL module to the die attached to the substrate.

22. The apparatus of claim 21, wherein the apparatus comprises a plurality of power delivery blocks, each of the power delivery blocks comprising a plurality of power vias.

23. The apparatus of claim 21, wherein the power delivery block comprises a printed circuit board.

24. The apparatus of claim 21, wherein the power delivery block further comprises a via for transmitting communications therethrough.

25. The apparatus of claim 21, wherein the cold plate further comprises an opening for transmitting optics therethrough.

26. A method comprising:
inserting a power delivery block into a cold plate, the power delivery block comprising an electrical path extending from a first surface of the cold plate to a second surface of the cold plate;
attaching a point-of-load (POL) module to said first surface of the cold plate; and
attaching a substrate to said second surface of the cold plate, wherein a die is attached to an opposite side of the substrate;
wherein power is distributed from the POL module to the die through the power delivery block in the cold plate.

27. The method of claim 26, wherein multiple chips are attached to the substrate, at least one of the chips comprising a photonic chip, and further comprising forming an opening in the cold plate for transferring optics therethrough.

28. The method of claim 26, further comprising thermally coupling the die with a second cold plate.

29. The method of claim 26, wherein the power delivery block comprises a printed circuit board and the electrical path comprises a power via for transferring the power through the cold plate.

30. The method of claim 26, wherein the cold plate comprises a plurality of power delivery blocks, each of the power delivery blocks comprising a plurality of power vias.

* * * * *